(12) United States Patent
Chang et al.

(10) Patent No.: US 8,547,023 B2
(45) Date of Patent: Oct. 1, 2013

(54) LED LIGHT SOURCE MODULE

(75) Inventors: Chih-Yang Chang, Taoyuan County (TW); Su-Wen Lai, Taipei (TW)

(73) Assignee: Rui Teng Opto Technology Co., Ltd., Pingzhen (TW)

( * ) Notice: Subject to any disclaimer, the term of this patent is extended or adjusted under 35 U.S.C. 154(b) by 433 days.

(21) Appl. No.: 12/825,072

(22) Filed: Jun. 28, 2010

(65) Prior Publication Data

US 2011/0316420 A1 Dec. 29, 2011

(51) Int. Cl.
*F21V 23/00* (2006.01)
*H01L 33/00* (2010.01)

(52) U.S. Cl.
USPC ............................................ 315/130; 257/82

(58) Field of Classification Search
USPC .................. 315/130, 51, 71, 133; 257/82, 98; 250/229, 216
See application file for complete search history.

(56) References Cited

U.S. PATENT DOCUMENTS 7,420,157 B2 * 9/2008 Kuroda ..................... 250/231.13
2008/0296589 A1 * 12/2008 Speier et al. ..................... 257/82

* cited by examiner

*Primary Examiner* — Daniel D Chang
(74) *Attorney, Agent, or Firm* — Tracy M. Heims; Apex Juris, pllc

(57) ABSTRACT

A light emitting diode (LED) light source module includes a circuit substrate, a driving IC electrically coupled to the circuit substrate and having at least one input terminal and an output terminal, an LED coupled onto the circuit substrate and electrically coupled to an output terminal of the driving IC, and a packaging layer, having a transparent structure shaped by a colloidal solidification, such that the transparent structure is covered outside the driving IC and LED, and the LED light source module covers the driving IC and LED by the transparent structure of the packaging layer, and serves as a light source module of a lamp directly without the need of installing another driving IC to the lamp, and promotes its extensive use in LED lamps.

11 Claims, 5 Drawing Sheets

A-A'

B-B'

C-C'

D-D'

E-E'

LED LIGHT SOURCE MODULE

FIELD OF THE INVENTION

The present invention relates to a light source module, in particular to a package structure of a light emitting diode (LED) light source module that can be installed and used as a lamp directly.

BACKGROUND OF THE INVENTION

In general, a package structure of an LED module comprises a substrate for carrying an LED, and the bottom of the substrate is an aluminum substrate, a ceramic substrate or a fiber grass substrate, and an electrode contact can be formed on a surface of the substrate, so that one or more LEDs can be mounted onto the surface of the substrate, and the LED is electrically coupled to the electrode contact, and then an encapsulation material is filled onto the LED. After the encapsulation material is solidified and shaped, a transparent structure for sealing the LED is formed, and the transparent structure can produce an expected optical mechanism to the light source of the LED.

When a general LED module is used as a lamp, it is necessary to supply corresponding voltage and current to the LED, since the LED module cannot be connected electrically and directly. Therefore, a driving IC and a current resistor are required for regulating the voltage. In general, the conventional lamp includes components such as the driving IC and the current resistor installed in the lamp, but it does not combine the driving IC and the current resistor onto the substrate of the LED. Therefore, the LED module packaged by the aforementioned method cannot be connected electrically and used directly as a lamp, thus failing to promote its extensive applications in downstream industries.

Therefore, it is a main subject of the invention to disclose an LED light source module that can be electrically connected to emit light and directly used as a lamp without requiring an additional circuit design of the lamp.

SUMMARY OF THE INVENTION

It is a primary objective of the present invention to provide an LED light source module with an improved structure comprising a circuit substrate, a driving IC, an LED and an packaging layer, wherein components such as the driving IC can be combined onto the circuit substrate directly, and the packaging layer can be used for packaging both driving IC and LED to achieve the effects of protecting the driving IC and LED, and connecting the LED light source module directly and electrically for its use.

To achieve the foregoing and other objectives, the present invention provides an LED light source module comprising: a circuit substrate, having an electrode contact; a driving IC, installed on the circuit substrate, and including at least one input terminal and an output terminal, and the input terminal being electrically coupled to the electrode contact of the circuit substrate; an LED, coupled onto the circuit substrate, and electrically coupled to an output terminal of the driving IC; and a packaging layer, having a transparent structure shaped by a colloidal solidification, and the transparent structure being covered outside the driving IC and the LED, and the transparent structure producing an expected optical mechanism to a light source of the LED, so as to assemble the LED light source module that can be connected electrically and used directly as a lamp.

A plurality of LEDs are combined onto the circuit substrate to enhance the illumination of the LED light source module, and the circuit substrate is combined with a ring with a protruding height, and the driving IC and the LED are installed on the circuit substrate in the ring, and a colloid of the packaging layer is filled into the ring and solidified and shaped to form a transparent structure, so as to achieve the effect of shaping the packaging layer. The circuit substrate includes a groove with a depth concavely formed thereon, and the driving IC and the LED are installed in the groove, and a colloid of the packaging layer is filled into the groove and solidified and shaped to form a transparent structure, so as to achieve the effect of shaping the packaging layer.

The present invention further comprises at least one current resistor electrically coupled between an output terminal of the driving IC and the LED, and covered by a transparent structure of the packaging layer. In addition, the circuit substrate is an aluminum substrate, a ceramic substrate or a fiber glass substrate for achieving a heat dissipating effect.

Therefore, the LED light source module of the present invention packages both driving IC and LED into the transparent structure of the packaging layer to achieve the effects of protecting the driving IC and the LED, and connecting the electrode contact directly and electrically onto the circuit substrate, and uses the driving IC to regulate the voltage, so to drive the LED to emit light and achieve the effects of electrically connecting and directly using the LED light source module as a lamp.

DESCRIPTION OF THE PREFERRED EMBODIMENTS

The objects, characteristics and effects of the present invention will become apparent with the detailed description of the preferred embodiments and the illustration of related drawings as follows.

Figure 1:
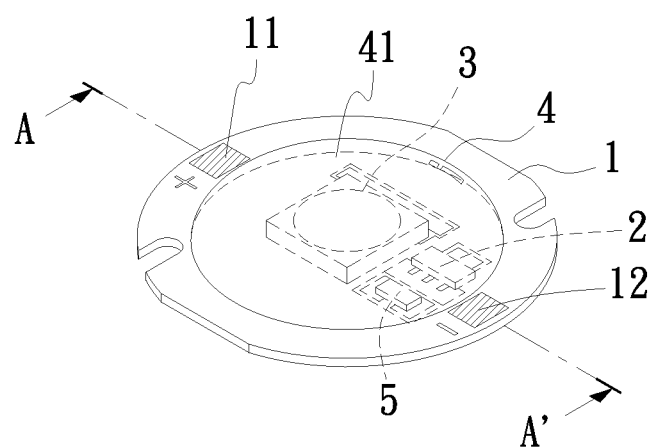
FIG. 1 is a perspective view of a first preferred embodiment of the present invention.
Figure 2:
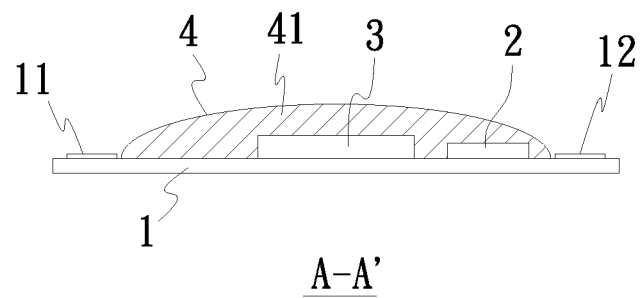
FIG. 2 is a cross-sectional view of a first preferred embodiment of the present invention.

With reference to FIGS. 1 and 2 for a perspective view and a cross-sectional view of an LED light source module in accordance with a first preferred embodiment of the present invention respectively, the LED light source module comprises: a circuit substrate 1, being a circular aluminum substrate, a ceramic substrate or a fiber glass substrate, and used as a carrier of an LED, and having a heat dissipating function, and the circuit substrate 1 having an electrode contact 11, 12;

a driving IC 2, installed on the circuit substrate 1, and including at least one input terminal and an output terminal, and the input terminal being electrically coupled to the electrode contact 11 of the circuit substrate 1 for receiving a DC voltage source; an LED 3, being a pre-packaged chip or a bare chip, combined onto the circuit substrate 1, and electrically coupled to an output terminal of the driving IC 2; a packaging layer 4, having a transparent structure 41 shaped by a colloidal solidification, and the transparent structure 41 being a semicircular body, such that the transparent structure 41 can be covered onto the exterior of the driving IC 2 and the LED 3, and the transparent structure 41 can produce an expected optical mechanism to a light source of the LED 3, and the LED light source module of the present invention can be connected electrically and used directly as a lamp.

Figure 3:
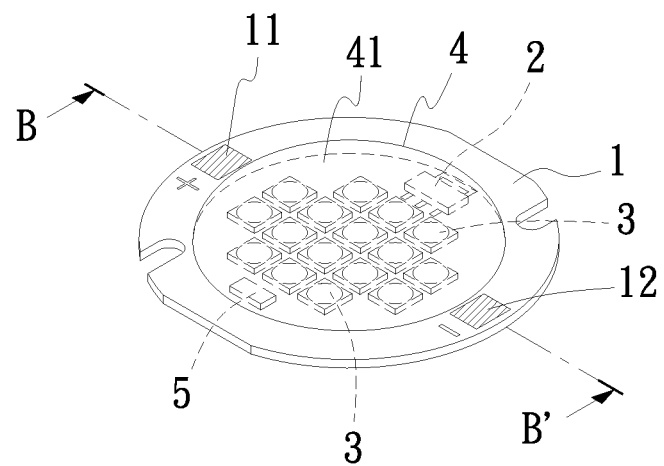
FIG. 3 is a perspective view of a second preferred embodiment of the present invention.
Figure 4:
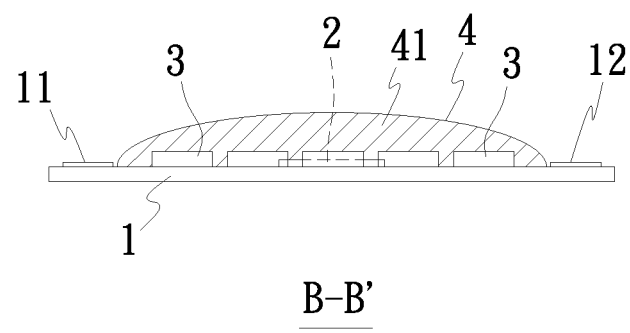
FIG. 4 is a cross-sectional view of a second preferred embodiment of the present invention.

With reference to FIGS. 3 and 4 for a perspective view and a cross-sectional view of an LED light source module in accordance with a second preferred embodiment of the present invention respectively, a plurality of LEDs 3 are installed onto the circuit substrate 1 to enhance the illumination of the LED light source module, wherein the LEDs 3 are connected in series or in parallel with each other, or the LEDs 3 are connected in series first, and then connected in parallel with another set of serially connected LEDs 3.

Figure 5:
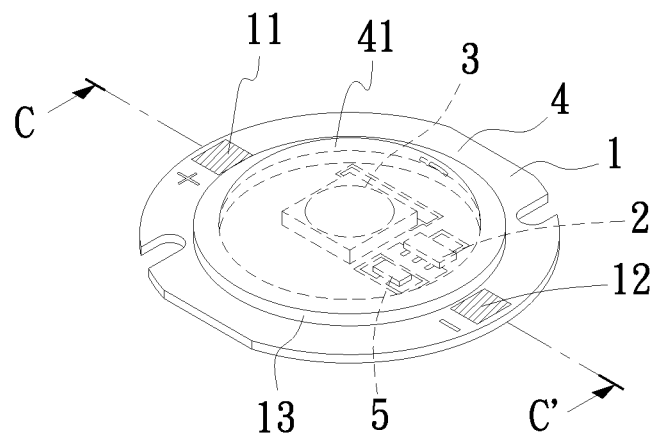
FIG. 5 is a perspective view of a third preferred embodiment of the present invention.
Figure 6:
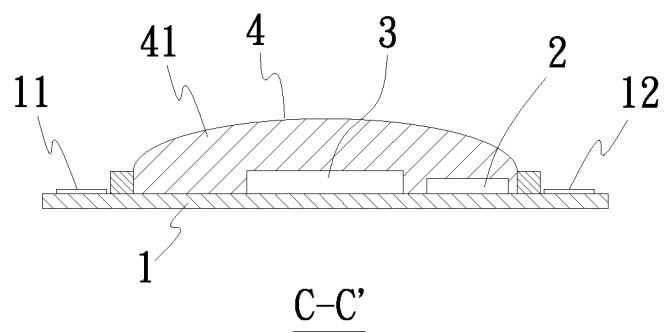
FIG. 6 is a cross-sectional view of a third preferred embodiment of the present invention.

With reference to FIGS. 5 and 6 for a perspective view and a cross-sectional view of an LED light source module in accordance with a third preferred embodiment of the present invention respectively, the circuit substrate 1 comprises a ring 13 with a protruding height coupled onto the circuit substrate 1, such that the driving IC 2 and the LED 3 are installed onto the circuit substrate 1 in the ring 13, and a colloid of the packaging layer 4 is filled into the ring 13 and solidified and shaped to produce a semicircular transparent structure 41 that can be passed through the ring 13 to achieve the effect of shaping and securely combining the packaging layer 4.

Figure 7:
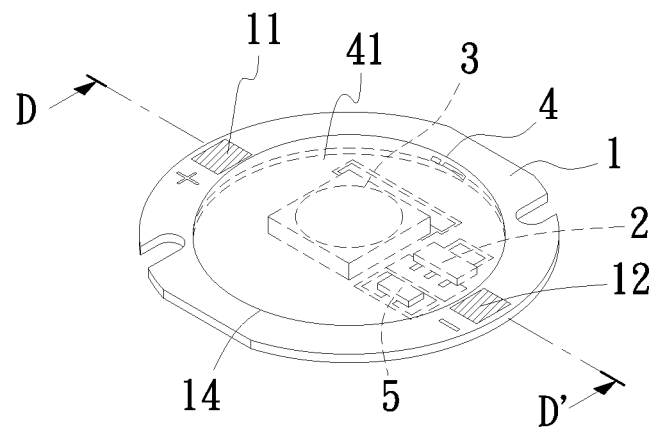
FIG. 7 is a perspective view of a fourth preferred embodiment of the present invention.
Figure 8:
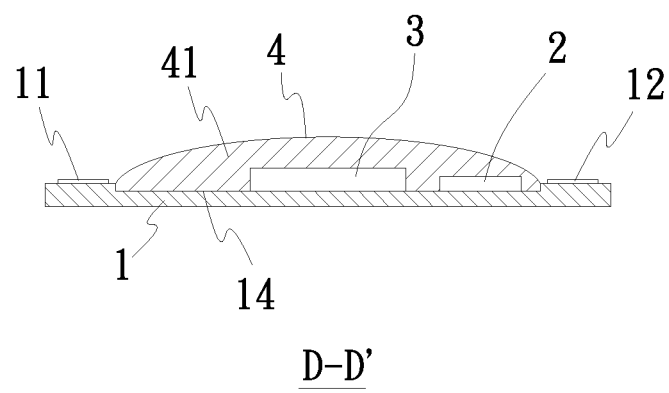
FIG. 8 is a cross-sectional view of a fourth preferred embodiment of the present invention.

With reference to FIGS. 7 and 8 for a perspective view and a cross-sectional view of an LED light source module in accordance with a fourth preferred embodiment of the present invention respectively, the circuit substrate 1 comprises a groove 14 with a depth concavely formed on the circuit substrate 1, and the groove 14 can be formed by etching or an equivalent manufacturing method, such that the driving IC 2 and the LED 3 are installed in the groove 14, and the colloid of the packaging layer 4 is filled into the groove 14 and solidified and shaped to form a transparent structure 41, so as to achieve the effect of shaping and securely combining the packaging layer 4.

Figure 9:
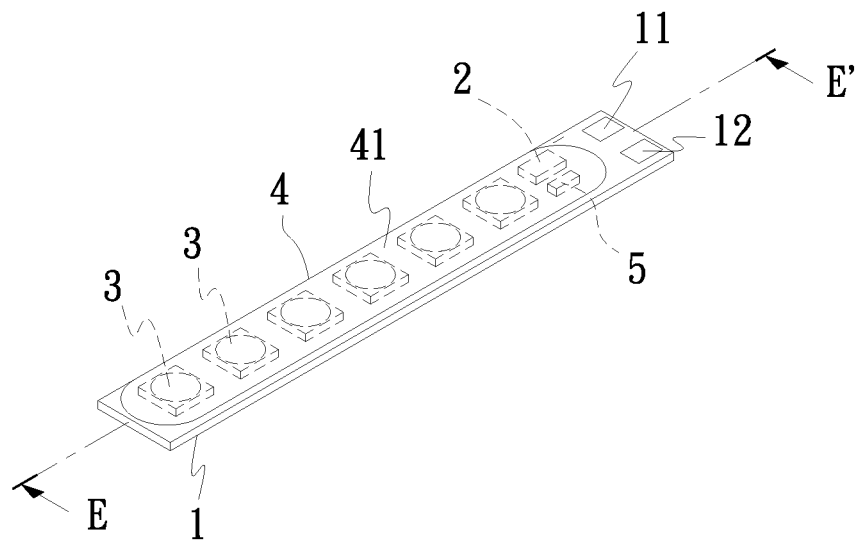
FIG. 9 is a perspective view of a fifth preferred embodiment of the present invention.
Figure 10:
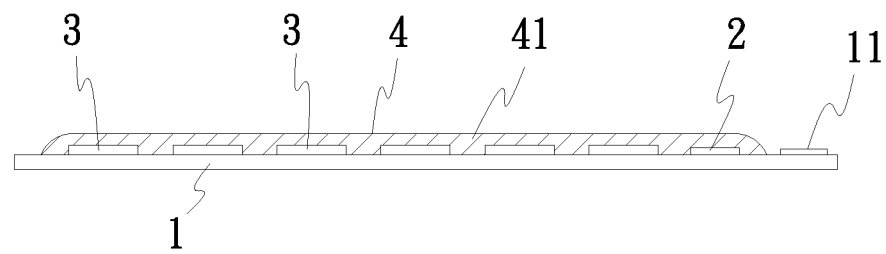
FIG. 10 is a cross-sectional view of a fifth preferred embodiment of the present invention.

With reference to FIGS. 9 and 10 for a perspective view and a cross-sectional view of an LED light source module in accordance with a fifth preferred embodiment of the present invention respectively, the circuit substrate 1 is also in a rectangular bar shape, such that a plurality of LEDs 3 are arranged and combined onto the circuit substrate 1, and the driving IC 2 is also installed onto the circuit substrate 1 by the aforementioned connecting method, and the colloid of the packaging layer 4 is filled onto the driving IC 2 and the LED 3 to form the transparent structure 41, such that the transparent structure 41 can produce an expected optical mechanism to the light source of the LED 3.

In the design of the packaging structure of the LED light source module in accordance with the present invention, both driving IC 2 and LED 3 are packaged into the transparent structure 41 of the packaging layer 4 at the same time to achieve the effect of protecting the driving IC 2 and the LED 3. Particularly, the design of the packaging structure of the LED light source module 1 can directly and electrically connect the electrode contacts 11, 12 of the circuit substrate and regulate the voltage by the driving IC 2, so as to drive the LED 3 to emit light. Obviously, the present invention can achieve the effect of electrically connecting and directly using the LED light source module as a lamp. After a downstream industry or a consumer obtains the LED light source module, the LED light source module can be used directly as a lamp, which promotes an extensive use of the LED light source module.

In FIGS. 1 to 10, the LED light source module of the present invention further comprises: at least one current resistor 5 electrically coupled between an output terminal of the driving IC 2 and the LED 3, and covered by the transparent structure 41 of the packaging layer 4.

In summation of the description above, the present invention provides an improved structure having the circuit substrate, the driving IC, LED and the packaging layer to combine components such as the driving IC onto the circuit substrate, and uses the packaging layer to package both driving IC and LED to protect the driving IC and LED, and also electrically connects the LED light source module directly for its application. Obviously, the present invention complies with patent application requirements, and products derived from the present invention can meet the present market requirements sufficiently.

While the invention has been described by means of specific embodiments, numerous modifications and variations could be made thereto by those skilled in the art without departing from the scope and spirit of the invention set forth in the claims.

What is claimed is:

1. A light emitting diode (LED) light source module, comprising:
    a circuit substrate, having an electrode contact;
    a driving IC, installed on the circuit substrate, and including at least one input terminal and an output terminal, and the input terminal being electrically coupled to the electrode contact of the circuit substrate;
    an LED, coupled onto the circuit substrate, and electrically coupled to an output terminal of the driving IC; and
    a packaging layer, having a transparent structure shaped by a colloidal solidification, and the transparent structure being covered onto the outside of the driving IC and the LED, and the transparent structure producing an expected optical mechanism to a light source of the LED, so as to assemble the LED light source module that can be connected electrically and used directly as a lamp.

2. The LED light source module of claim 1 wherein a plurality of LEDs are combined onto the circuit substrate.

3. The LED light source module of claim 1 wherein the circuit substrate is combined with a ring with a protruding height, and the driving IC and the LED are installed on the circuit substrate in the ring, and a colloid of the packaging layer is filled into the ring and solidified and shaped to form a transparent structure.

4. The LED light source module of claim 1 wherein the circuit substrate includes a groove with a depth concavely disposed thereon, and the driving IC and the LED are installed in the groove, and a colloid of the packaging layer is filled into the groove, and solidified and shaped to form a transparent structure.

5. The LED light source module of claim 1, further comprising at least one current resistor electrically coupled between an output terminal of the driving IC and the LED and covered by a transparent structure of the packaging layer.

6. The LED light source module of claim 2, further comprising at least one current resistor electrically coupled between an output terminal of the driving IC and the LED and covered by a transparent structure of the packaging layer.

7. The LED light source module of claim 3, further comprising at least one current resistor electrically coupled between an output terminal of the driving IC and the LED and covered by a transparent structure of the packaging layer.

8. The LED light source module of claim 4, further comprising at least one current resistor electrically coupled between an output terminal of the driving IC and the LED and covered by a transparent structure of the packaging layer.

9. The LED light source module of claim 1 wherein the circuit substrate is one selected from the collection of an aluminum substrate, a ceramic substrate and a glass fiber substrate.

10. The LED light source module of claim 9 wherein the circuit substrate is in a circular shape.

11. The LED light source module of claim 9 wherein the circuit substrate is in a rectangular bar shape.

\* \* \* \* \*